(12) United States Patent
Kim et al.

(10) Patent No.: US 10,510,975 B2
(45) Date of Patent: Dec. 17, 2019

(54) LIGHT EMITTING DIODE AND LIGHT EMITTING DIODE DISPLAY INCLUDING THE SAME

(71) Applicant: SAMSUNG DISPLAY CO., LTD., Yongin-si, Gyeonggi-do (KR)

(72) Inventors: Dong Chan Kim, Yongin-si (KR); Dong Hoon Kim, Yongin-si (KR); Won Jong Kim, Yongin-si (KR); Ji Young Moon, Yongin-si (KR); Dong Kyu Seo, Yongin-si (KR); Ji Hye Lee, Yongin-si (KR); Da Hea Im, Yongin-si (KR); Sang Hoon Yim, Yongin-si (KR); Yoon Hyeung Cho, Yongin-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 15/677,137

(22) Filed: Aug. 15, 2017

(65) Prior Publication Data

US 2018/0123071 A1    May 3, 2018

(30) Foreign Application Priority Data

Oct. 31, 2016 (KR) ........................ 10-2016-0143316

(51) Int. Cl.
*H01L 51/54* (2006.01)
*H01L 51/50* (2006.01)
(Continued)

(52) U.S. Cl.
CPC ...... *H01L 51/5092* (2013.01); *H01L 27/3246* (2013.01); *H01L 51/504* (2013.01); *H01L 51/5072* (2013.01); *H01L 51/5265* (2013.01)

(58) Field of Classification Search
CPC ............. H01L 51/504; H01L 51/5072; H01L 51/5092; H01L 51/5265; H01L 27/3246
See application file for complete search history.

(56) References Cited

U.S. PATENT DOCUMENTS 7,288,420 B1 * 10/2007 Yamazaki ........... H01L 27/3211
                                                            438/29
7,931,975 B2 * 4/2011 Begley .................. C09K 11/06
                                                            313/504

(Continued)

FOREIGN PATENT DOCUMENTS

CN       105390618 A      3/2016
JP       2000-268968 A    9/2000
(Continued)

OTHER PUBLICATIONS

Wang, et al., J. Less-Common Metals. 127, 19 224 (1987).
(Continued)

*Primary Examiner* — Mary A Wilczewski
(74) *Attorney, Agent, or Firm* — Lewis Roca Rothgerber Christie LLP

(57) ABSTRACT

A light emitting diode and a light emitting diode display, the light emitting diode including a first electrode; a second electrode overlapping the first electrode; an emission layer between the first electrode and the second electrode; and an electron injection layer between the second electrode and the emission layer, wherein the electron injection layer includes a lanthanide element, an alkali meta first element, and a halogen second element, and wherein the first element and the second element are included in the electron injection layer in an amount of 1 vol % to 20 vol %, based on a total volume of a material including the lanthanide element, the first element, and the second element.

23 Claims, 8 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 10,003,040 B2* | 6/2018 | Kim | H01L 51/5092 |
| 2007/0085086 A1* | 4/2007 | Gohara | H01L 51/5203 |
| | | | 257/79 |
| 2015/0214498 A1* | 7/2015 | Ichikawa | H01L 51/504 |
| | | | 257/40 |
| 2016/0056400 A1 | 2/2016 | Kim et al. | |
| 2016/0056403 A1 | 2/2016 | Kim et al. | |
| 2016/0079557 A1* | 3/2016 | Kim | H01L 51/5088 |
| | | | 257/40 |
| 2016/0248034 A1 | 8/2016 | Kim et al. | |
| 2016/0285035 A1 | 9/2016 | Kim et al. | |
| 2017/0186981 A1* | 6/2017 | Han | H01L 51/0077 |
| 2017/0222162 A1* | 8/2017 | Lee | H01L 51/0077 |
| 2018/0047929 A1* | 2/2018 | Kim | H01L 51/5072 |
| 2018/0123071 A1* | 5/2018 | Kim | H01L 27/3246 |
| 2018/0269265 A1* | 9/2018 | Kim | H01L 27/3209 |

FOREIGN PATENT DOCUMENTS

| | | |
|---|---|---|
| KR | 10-1182447 B1 | 9/2012 |
| KR | 10-2016-0024349 A | 3/2016 |
| TW | 201614893 A | 4/2016 |

OTHER PUBLICATIONS

Chen et al., J. Less-Common Met. 149, 95 99 (1989).
Wang, et al., Journal of Alloys and Compounds 181, 515 519 (1992).
Qiao, et al. Journal of Alloys and Compounds, 201, 217 (1993).
Qiao, et al., J. Solid State Chem. 114, 146 (1995).
Rhee, Journal of the Korean Chemical Society 41, 9 (1997).
Zhao, et al. Journal of Alloys and Compounds 250, 405 408 (1997).
Sun, et al., J. Solid State Chem. 136, 134 136 (1998).
Salem, Turk J Phys 27, 569 577 (2003).
Wu, et al., Applied Physics Letters 87, 212108, (2005).
Karaman et al.,Transferable Deformation-Dipole Model for Ionic Materials (2007).
Extended European Search Report dated Mar. 29, 2018, of the corresponding European Patent Application No. 17199274.6.

* cited by examiner

LIGHT EMITTING DIODE AND LIGHT EMITTING DIODE DISPLAY INCLUDING THE SAME

CROSS-REFERENCE TO RELATED APPLICATION

Korean Patent Application No. 10-2016-0143316, filed on Oct. 31, 2016, in the Korean Intellectual Property Office, and entitled: "Light Emitting Diode and Light Emitting Diode Display Including the Same," is incorporated by reference herein in its entirety.

BACKGROUND

1. Field

Embodiments relate to a light emitting diode and a light emitting diode display.

2. Description of the Related Art

A light emitting diode is an element in which holes supplied from an anode and electrons supplied from a cathode are combined in an organic emission layer to form excitons, and light is emitted while the excitons are stabilized. The light emitting diode may have several merits such as a wide viewing angle, a fast response speed, a thin thickness, and lower power consumption such that the light emitting diode is widely applied to various electrical and electronic devices such as a television, a monitor, a mobile phone, etc.

The above information disclosed in this Background section is only for enhancement of understanding of the background of the invention and therefore it may contain information that does not form the prior art that is already known in this country to a person of ordinary skill in the art.

SUMMARY

The embodiments may be realized by providing a light emitting diode including a first electrode; a second electrode overlapping the first electrode; an emission layer between the first electrode and the second electrode; and an electron injection layer between the second electrode and the emission layer, wherein the electron injection layer includes a lanthanide element, an alkali metal first element, and a halogen second element, and wherein the first element and the second element are included in the electron injection layer in an amount of 1 vol % to 20 vol %, based on a total volume of a material including the lanthanide element, the first element, and the second element.

The electron injection layer may include a dipole material, the dipole material including the lanthanide element and the second element that have different polarities from each other.

The dipole material may include a compound including the lanthanide element as a bivalent element or a compound including the lanthanide element as a trivalent element. The electron injection layer may include a first compound made of the lanthanide element, the first element, and the second element, and the first compound may have a perovskite structure.

The electron injection layer may include a positive ion of the first element.

The electron injection layer may include a monomolecular molecule including the lanthanide element.

The electron injection layer may include a dipole material having the lanthanide element and the second element with different polarities from each other, a first compound made of the lanthanide element, the first element, and the second element having a perovskite structure, a positive ion of the first element, or a monomolecular molecule including the lanthanide element.

The lanthanide element may be ytterbium (Yb), samarium (Sm), or europium (Eu).

The first element may be potassium (K), rubidium (Rb), or cesium (Cs), and the second element may be chlorine (Cl), bromine (Br), or iodine (I).

The first element may be potassium (K) and the second element is iodine (I).

The second electrode may include magnesium (Mg) or ytterbium (Yb), and an alloy of silver (Ag).

The magnesium (Mg) or ytterbium (Yb) may be included in the second electrode in an amount of 10 vol % to 30 vol %.

The light emitting diode may further include an electron transport layer between the emission layer and the electron injection layer, wherein the electron transport layer includes an organic material.

The emission layer may include a red emission layer, a green emission layer, and a blue emission layer, and an auxiliary layer may be included between the blue emission layer and the first electrode.

The light emitting diode may further include a red resonance auxiliary layer between the red emission layer and the first electrode; and a green resonance auxiliary layer between the green emission layer and the first electrode.

The embodiments may be realized by providing a light emitting diode including a first electrode; a second electrode overlapping the first electrode; an emission layer between the first electrode and the second electrode; and an electron injection layer between the second electrode and the emission layer, wherein the electron injection layer includes a lanthanide element, an alkali metal first element, and a halogen second element, and the lanthanide element has a work function of 2.7 eV or less.

The electron injection layer may include a compound including the lanthanide element as a bivalent element or a compound including the lanthanide element as a trivalent element.

The electron injection layer may further include a monomolecular molecule including the lanthanide element.

The lanthanide element may be ytterbium (Yb), samarium (Sm), or europium (Eu).

The electron injection layer may further include a first compound made of the lanthanide element, the first element, and the second element; and the first compound may have a perovskite structure.

The embodiments may be realized by providing a light emitting diode display including a substrate; a thin film transistor on the substrate; and a light emitting diode connected to the thin film transistor, wherein the light emitting diode includes a first electrode, a second electrode overlapping the first electrode, an emission layer between the first electrode and the second electrode, and an electron injection layer between the second electrode and the emission layer, the electron injection layer includes a element, an alkali metal first element, and a halogen second element and the first and the second element are included in the electron injection layer in an amount of 1 to 20 vol %, based on a total volume of a material including the lanthanide element, the first element, and the second element.

The electron injection layer may include a dipole material having the lanthanide element and the second element that have different polarities from each other.

The dipole material may include a compound including the lanthanide element as a bivalent element or a compound including the lanthanide element as a trivalent element. The electron injection layer may include a first compound made of the lanthanide element, the first element, and the second element; and the first compound may have the perovskite structure.

The emission layer may emit white light or blue light by combining light from a plurality of layers.

The light emitting diode display may further include a color conversion layer on the second electrode and overlying the emission layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
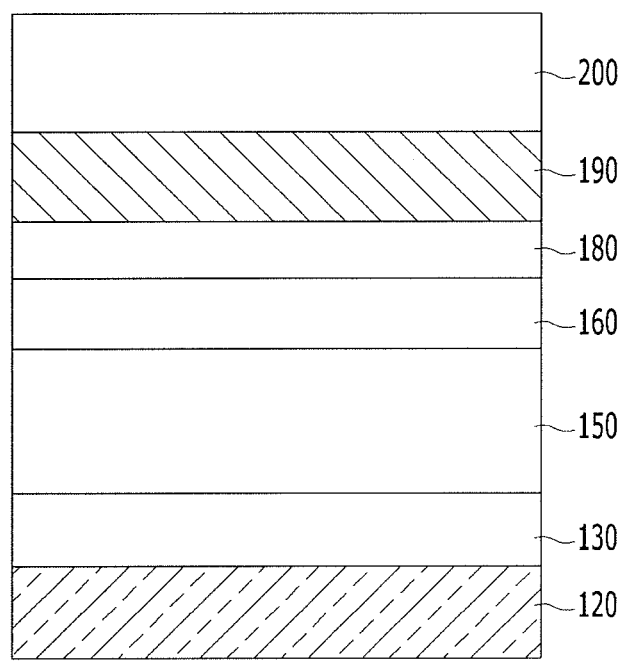
FIG. 1 illustrates a schematic cross-sectional view of a light emitting diode according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "includes," "including," "comprises" or "comprising" will be understood to imply the inclusion of stated elements but not the exclusion of any other elements.

Further, in this specification, the phrase "on a plane" means viewing a target portion from the top, e.g., in plan view, and the phrase "on a cross-section" means viewing a cross-section formed by vertically cutting a target portion from the side.

Figure 2:
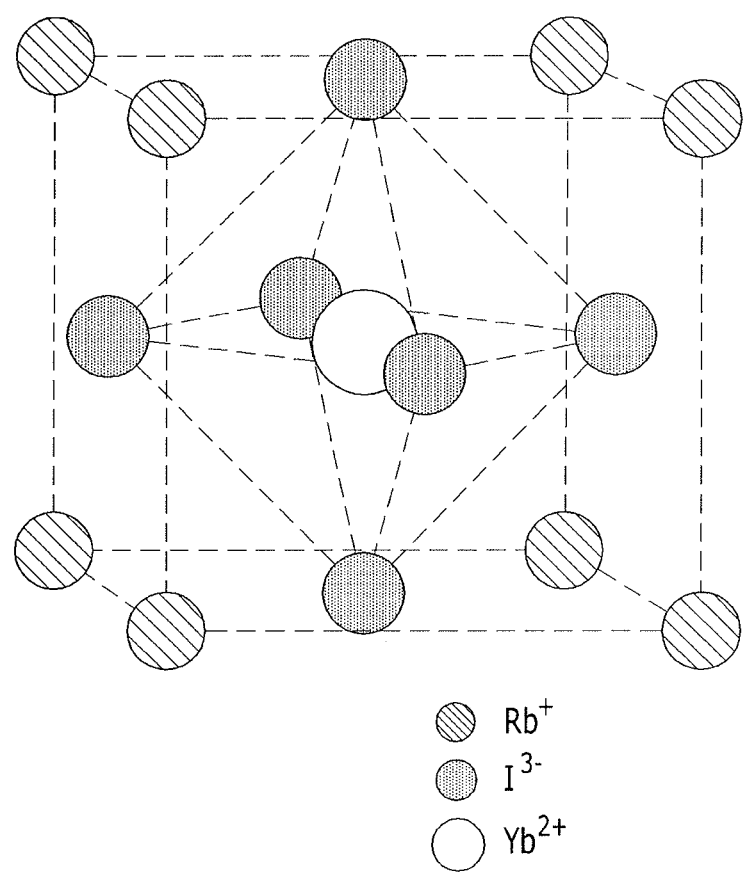
FIG. 2 illustrates a view showing a perovskite structure according to an exemplary embodiment of the present disclosure.

FIG. 1 illustrates a schematic cross-sectional view of a light emitting diode according to an exemplary embodiment of the present disclosure. FIG. 2 illustrates a view showing a perovskite structure according to an exemplary embodiment of the present disclosure.

Referring to FIG. 1, a light emitting diode according to the present exemplary embodiment may include, e.g., a first electrode 120 and a second electrode 190 overlapping each other (e.g., facing one another), an emission layer 150 disposed between the first electrode 120 and the second electrode 190, a hole transport layer 130 disposed between the first electrode 120 and the emission layer 150, an electron transport layer 160 disposed between the emission layer 150 and the second electrode 190, an electron injection layer 180 disposed between the electron transport layer 160 and the second electrode 190, and a capping layer 200 disposed on the second electrode 190.

In an implementation, the first electrode 120 may be a reflecting electrode.

In the present disclosure, the reflecting electrode may be defined as an electrode including a material having a characteristic of reflecting light emitted from the emission layer 150 to be transmitted to the second electrode 190. The reflection characteristic may mean that reflectivity of incident light is about 70% or more to about 100% or less, or about 80% or more to about 100% or less.

The first electrode 120 may include, e.g., silver (Ag), aluminum (Al), chromium (Cr), molybdenum (Mo), tungsten (W), titanium (Ti), gold (Au), palladium (Pd), or alloys thereof to be used as the reflection layer while having the anode function. In an implementation, the first electrode 120 may have a triple layer structure of silver (Ag)/indium tin oxide (ITO)/silver (Ag) or indium tin oxide (ITO)/silver (Ag)/indium tin oxide (ITO).

In an implementation, the first electrode 120 may be formed by using a sputtering method, a vapor phase deposition method, an ion beam deposition method, or an electron beam deposition method.

In an implementation, the hole transport layer 130 may correspond to an auxiliary layer disposed between the first electrode 120 and the emission layer 150. In an implementation, the hole transport layer 130 may include at least one of the hole injection layer and the hole transport layer 130. The hole injection layer may facilitate injection of holes from the first electrode 120, and the hole transport layer may perform a function of smoothly transporting the holes transmitted from the hole injection layer. In an implementation, the hole transport layer 130 may be formed of a dual-layered structure in which the hole transport layer is disposed on the hole injection layer, or a single layer in which a material forming the hole injection layer and the material forming the hole transport layer are mixed.

The hole transport layer 130 may include the organic material. In an implementation, the hole transport layer 130 may include, e.g., NPD (N,N-dinaphthyl-N,N'-diphenyl benzidine), TPD (N,N'-bis-(3-methylphenyl)-N,N'-bis-(phenyl)-benzidine), or s-TAD, MTDATA (4,4',4''-tris(N-3-methylphenyl-N-phenyl-amino)-triphenylamine).

The emission layer 150 may be disposed on the hole transport layer 130. The emission layer 150 may include a light emitting material displaying a particular color. For example, the emission layer 150 can display a primary color such as blue, green, or red, or a combination thereof.

A thickness of the emission layer 150 may be in a range of 10 nm to 50 nm. In an implementation, the emission layer 150 may include a host and a dopant. In an implementation, the emission layer 150 may contain materials for emitting red, green, blue, and white light, and may be formed by using a phosphorescent or fluorescent material.

When the emission layer 150 emits red light, the emission layer 150 may include a host material that includes CBP (carbazole biphenyl) or mCP (1,3-bis(carbazol-9-yl), and may be formed of a phosphorescent material including, e.g., PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), or PtOEP (platinum octaethylporphyrin), or a fluorescent material including PBD:Eu(DBM)3(phen) or perylene.

When the emission layer 150 emits green light, the emission layer 150 may include a host material including CBP or mCP, and may be made of a phosphorescent material including a dopant material including, e.g., Ir(ppy)$_3$ (fac-tris (2-phenylpyridine)iridium) or a fluorescent material including Alq3 (tris(8-hydroxyquinolino)aluminum).

When the emission layer 150 emits blue light, the emission layer 150 may include a host material including CBP or mCP, and may be made of a phosphorescent material including a dopant that includes. e.g., (4,6-F$_2$ppy)$_2$Irpic. In an implementation, the emission layer 150 may include the host material having an anthracene group, and may be made of a fluorescent material including the dopant including a diamine group or, e.g., spiro-DPVBi, Spiro-6P, distyrylbenzene (DSB), distyrylarylene (DSA), a PFO-based polymer, or a PPV-based polymer.

In an implementation, the emission layer 150 may be formed of an inorganic material such as a quantum dot.

The electron transport layer 160 and the electron injection layer 180 may be disposed between the emission layer 150 and the second electrode 190. The electron transport layer 160 may be disposed adjacent to the emission layer 150, and the electron injection layer 180 may be disposed adjacent to the second electrode 190.

The electron transport layer 160 may include the organic material. In an implementation, the electron transport layer 160 may be made of, e.g., Alq3 (tris(8-hydroxyquinolino) aluminum), PBD (2-[4-biphenyl-5-[4-tert-butylphenyl]]-1, 3,4-oxadiazole), TAZ (1,2,4-triazole), spiro-PBD (spiro-2-[4-biphenyl-5-[4-tert-butylphenyl]-1,3,4-oxadiazole), or BAlq(8-hydroxyquinoline beryllium salt).

The electron transport layer 160 may transmit the electrons from the second electrode 190 to the emission layer 150. Also, the electron transport layer 160 may help prevent the holes injected from the first electrode 120 from being moved into the second electrode 190 through the emission layer 150. For example, the electron transport layer 160 may have a function of a hole blocking layer, and may facilitate the combination of the holes and the electrons in the emission layer 150.

The electron injection layer 180 may have a function of improving the electron injection from the second electrode 190 to the electron transport layer 160. In an implementation, a thickness of the electron injection layer 180 may be in a range from about 2 Å to 25 Å by considering a process margin.

In an implementation, the electron injection layer 180 may include, e.g., a lanthanum group element (e.g., a lanthanide), a first element of an alkali metal (e.g., an alkali metal first element), and a second element of a halogen (e.g., a halogen second element). Next, a method for forming the electron injection layer 180 will be described in detail.

The electron injection layer 180 may be formed by codepositing a first material made of a metal and a second material made of a metal halide. For example, the first Material and the second material may be selected from materials that react with each other to cause a substitution reaction. For example, if the first material made of Yb (of the lanthanides) and the second material made of KI (of the metal halide) are codeposited, a substitution reaction such as Reaction Formula 1, Reaction Formula 2, or Reaction Formula 3, below, may result.

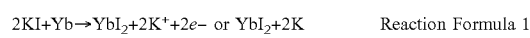
$$2KI+Yb \rightarrow YbI_2+2K^++2e- \text{ or } YbI_2+2K \quad \text{Reaction Formula 1}$$

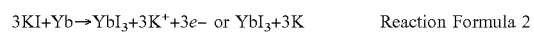
$$3KI+Yb \rightarrow YbI_3+3K^++3e- \text{ or } YbI_3+3K \quad \text{Reaction Formula 2}$$

$$3KI+Yb \rightarrow KYbI_3+2K^++2e- \text{ or } KYbI_3+2K \quad \text{Reaction Formula 3}$$

In an implementation, the first material and the second material may include metals having similar standard electrode potentials. For example, when the first material and the second material respectively include any one among a Group 1 element, a Group 2 element, and the lanthanide, a spontaneous reaction may result, depending on strong reactivity, as shown in an example below.

The first material made of the lanthanide (e.g., Yb, Eu, or Sm) and the second material made of the metal iodide (e.g., KI, RbI, or CsI) may be combined and codeposited, and the first material and the second material may react to form the layer.

In this case, as the layer becomes transparent, the conductivity may increase. However, if the first material were to be made of Ag and the second material were to be made of the metal iodide (e.g., KI, RbI, or CsI), and the materials were combined and codeposited to form a layer, the layer may not be transparent and the conductivity may not be increased. If the first material made of the lanthanide (e.g., Yb, Eu, or Sm) and the second material were to be made of CuI, and the materials were codeposited to form the layer, the layer may not be transparent and the conductivity may not be increased. In an implementation, the metals included in the first material and the second material may be materials having high reactivity to induce the spontaneous reaction.

Among the halide compounds, an iodine compound may have low electron affinity of the iodine itself and low electronegativity, thus it may be easy for the iodine compound to be dissociated to form an iodine vacancy or be combined with other reactive metals to generate a new compound. Accordingly, the electron injection characteristic may be improved by the compounds generated by a substitution reaction of the first material made of the metal and the metal iodine including the iodine.

Also, iodine may have a small refractive index difference with the organic material (compared to, e.g., fluorine), and it may be advantageous in terms of optical design. Further, iodine may have a low thermal evaporation temperature (compared to, e.g., fluorine), and a process characteristic may be advantageous. In addition, if fluorine were to be pyrolyzed, a gas could be emitted such that a vacuum degree may be decreased. Although heat may be applied to iodine, the vacuum degree may not decrease, as a solid may remain, instead of a gas.

In an implementation, a similar result to that of the metal iodide may appear when using a metal halide such as KCl, KBr, RbCl, RbBr, CsCl, or CsBr as the second material.

A conduction mechanism will be described below.

In an implementation, the metal included in the first material and the metal included in the second material may be substituted with each other. In this case, a valence electron number of the metal included in the first material may be equal to or larger than a valence electron number of the metal included in the second material. If the valence electron number of the metal included in the first material is greater than the valence electron number of the metal included in the second material, the conductivity due to the free electrons that are additionally generated may be improved.

Also, if the halogen elements included in the second material are moved in the first material to form a new material, the free electrons may be formed depending on a halogen vacancy, such that conductivity may be improved.

Further, conductivity may be improved by remaining metal ions that participate in the reaction.

In an implementation, the electron injection layer 180 may include a first compound made of the metal of the first material and a dipole material made of the halogen included in the second material and/or the metal of the first material and the metal halide of the second material. In this case, the dipole material may include at least one of a compound including the lanthanide element as a bivalent element and a compound including the lanthanide element as a trivalent element.

In an implementation, the metal of the first material may be the lanthanide element having a work function of about 2.7 eV or less. In an implementation, as the lanthanide element, ytterbium (Yb) having a work function of 2.6 eV, samarium (Sm) having a work function of 2.7 eV, or europium (Eu) having a work function of 2.5 eV may be used.

Among the lanthanide elements, ytterbium (Yb), samarium (Sm), and europium (Eu) may have a low ionization energy and a low ion radius such that they may be easily reacted with the alkali halide material and may be easily diffused in the alkali halide material. Accordingly, ytterbium (Yb), samarium (Sm), and europium (Eu) may be easily reacted with KI, RbI, or CsI such that a reactant of a perovskite structure and the alkali metal or the ion remain, thereby smoothly lowering an injection barrier.

The first compound may have the perovskite structure. The perovskite structure may be made of the lanthanide element, the alkali metal first element, and the halogen second element. Referring to the above-described Reaction Formulae 1, 2, and 3, the electron injection layer 180 may include a positive ion of the first element and a free electron as well as the described dipole material and the first compound having the perovskite structure.

In an implementation, the electron injection layer 180 may be formed by codepositing the first material made of the lanthanide metal and the second material made of the alkali metal halide. In an implementation, a content of the second material may be in a range from about 1 vol % to about 20 vol %, based on a total volume of the first material and the second material. If it is described based on the electron injection layer 180 as a final product, among the entire material having the lanthanide element, the first element, and the second element, a sum of the material having the first element and the material having the second element may have the range from about 1 vol % to about 20 vol %.

More of the first material having the lanthanide element may be present than the second material, and the electron injection layer 180 may include a monomolecular molecule including the lanthanide element.

In an implementation, the first material may be Yb, Eu, or Sm, and the second material may be KI, RbI, or CsI. For example, if RbI and Yb are codeposited, a chemical reaction may be induced such that at least one among $YbI_2$, $YbI_3$, and $RbYbI_3$ may be generated. Here, $RbYbI_3$, as shown in FIG. 2, may have the perovskite structure. In this way, even if the chemical reaction is induced, the remaining material may exist as RbI and Yb.

The electron injection layer 180 according to the present exemplary embodiment may be a single layer structure in which the first material and the second material are codeposited. If more of the first material than the second material is distributed in the electron injection layer 180, the conductivity may relatively increase and the transmittance may decrease (e.g., as compared with an opposite case).

Accordingly, in the present exemplary embodiment, a volume at which the first material and the second material are distributed may be optimized by considering the desired sheet resistance and transmittance of the light emitting diode.

Figure 3:
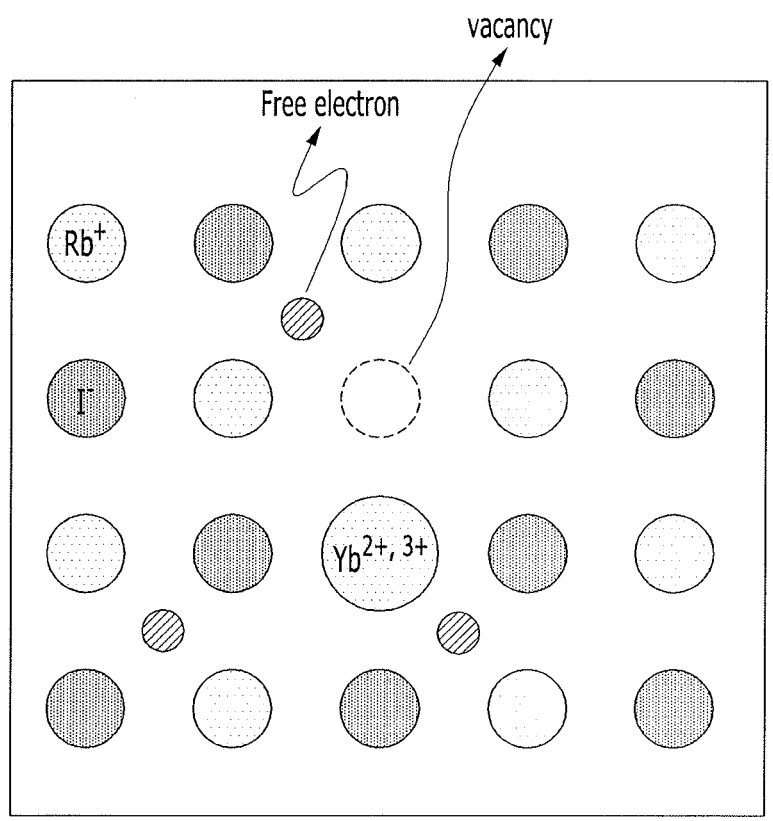
FIG. 3 illustrates a schematic view of an electron injection layer according to an exemplary embodiment of the present disclosure including a free electron.

FIG. 3 illustrates a schematic view of an electron injection layer according to an exemplary embodiment of the present disclosure including a free electron.

Referring to FIG. 3, one layer may be formed by using ytterbium (Yb) included in the first material and RbI included in the second material. Ytterbium (Yb) and RbI may react to form the conductor, e.g., Rb and Yb may be substituted with each other, resultantly the free electron may be formed somewhere in the reactant, and the free electron may be formed by an iodine vacancy generated depending on the $YbI_2$ or $YbI_3$ compound. In this way, because of the free electron formed by RbI that is one kind of the metal halide and/or the free electron formed by the iodine vacancy, and the metal ion, the electron injection layer 180 according to the present exemplary embodiment may have the conductivity such that the electron injection speed is very fast. Although RbI is described as the metal halide in FIG. 3, KI or CsI may be equally applied.

Next, a lifespan increase due to a driving voltage decrease when the content of the first material having the lanthanide element and the second material having the codeposited alkali metal halide is in the range of 1 vol % to 20 vol % will be described with reference to FIG. 4 and Table 1.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Figure 4:
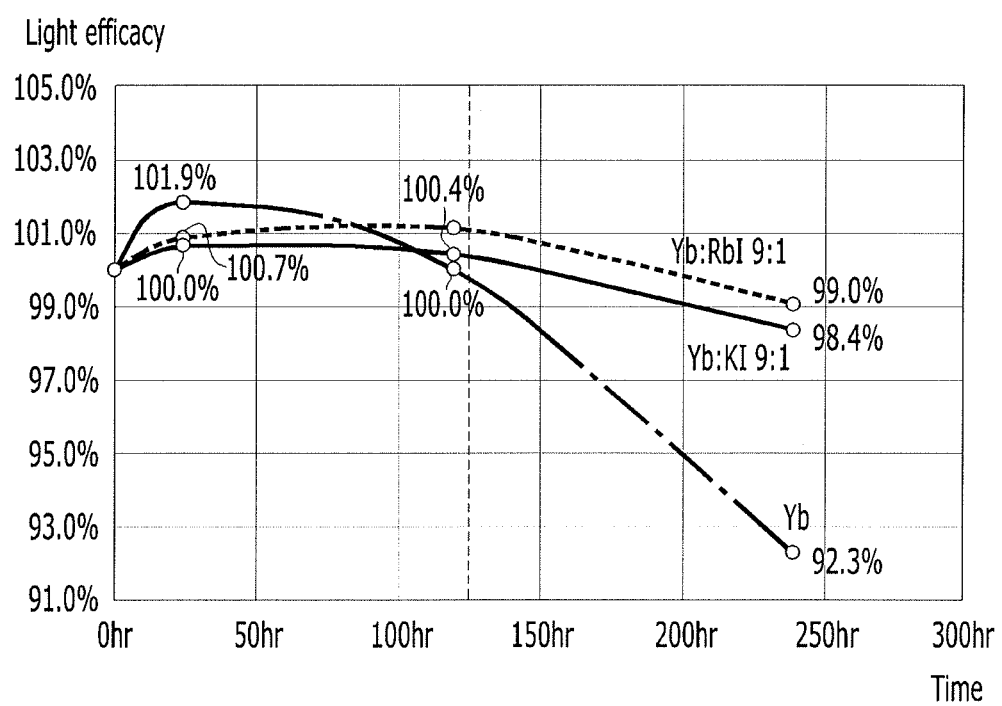
FIG. 4 illustrates a graph showing a lifespan level of a light emitting diode according to an exemplary embodiment of the present disclosure and a comparative example.

FIG. 4 illustrates a graph showing a lifespan level of a light emitting diode according to an exemplary embodiment of the present disclosure and a comparative example. In FIG. 4, Comparative Example 1 represents the light emitting diode including the electron injection layer formed of ytterbium (Yb) (e.g., represented by the one point chain line), and the light emitting diode according to the present exemplary embodiment is represented by Exemplary Embodiment 1 forming the electron injection layer by codepositing ytterbium (Yb) and RbI with a volume ratio of 9:1 (e.g., represented by the dashed line) and Exemplary Embodiment 2 forming the electron injection layer by codepositing ytterbium (Yb) and KI with a volume ratio of 9:1 (e.g., represented by the solid line).

Referring to FIG. 4, white light efficiency was evaluated for about 240 hours at 85° C. depending on time, and as a result, it may be that the light efficiency sharply deteriorated after 100 hours in the comparative example, which shows that the lifespan deteriorates. In contrast, in the exemplary embodiments according to the present disclosure, the light efficiency was maintained at more than 98.4% such that it may be confirmed that the lifespan is improved.

Table 1, below, shows results of evaluating the white/red/green/blue light efficiency depending on time for about 240 hours at 85° C. for Comparative Example 1, Exemplary Embodiment 1, and Exemplary Embodiment 2 described in FIG. 4.

Referring to Table 1, for Comparative Example 1, the driving voltage increased as time passed, however an increasing width of the driving voltage according to Exemplary Embodiments 1 and 2 was not large, but rather, the driving voltage was mainly reduced. In this way, in Exemplary Embodiments 1 and 2, power efficiency was improved by 17% to 26% due to the driving voltage reduction, and accordingly, as described in FIG. 4, the lifespan may be improved. A condition corresponding to 85° C. may be an environment similar to when a car exposed to sunlight from the outside. Accordingly, when the light emitting diode according to an exemplary embodiment of the present disclosure is applied to a car, there may be an effect that the driving voltage is maintained and the lifespan may be improved in the high temperature.

TABLE 1

| Example (time) | Driving voltage (V) | | | |
|---|---|---|---|---|
| | W | R | G | B |
| Comparative Example 1 (0 hours) | 3.85 | 2.49 | 3.17 | 2.72 |
| Comparative Example 1 (120 h) | 4.42 | 3.12 | 3.28 | 2.64 |
| Comparative Example 1 (240 hours) | 5.04 | 3.76 | 3.76 | 2.91 |
| Exemplary Embodiment 1 (0 hours) | 2.66 | 2.5 | 1.67 | 1.56 |
| Exemplary Embodiment 1 (120 hours) | 2.65 | 2.01 | 1.48 | 1.47 |
| Exemplary Embodiment 1 (240 hours) | 2.52 | 2.27 | 1.68 | 1.50 |
| Exemplary Embodiment 2 (0 hours) | 2.46 | 2.26 | 1.71 | 1.64 |
| Exemplary Embodiment 2 (120 hours) | 2.29 | 2.06 | 1.45 | 1.42 |
| Exemplary Embodiment 2 (240 hours) | 2.55 | 2.05 | 1.63 | 1.46 |

Hereinafter, the light efficiency and reliability of the element depending on the volume ratio of the first material having the lanthanide element and the second material having the alkali metal halide will be described.

Table 2, below, tabulates a case in which Comparative Example 1-1 forms the electron injection layer with ytterbium (Yb), and Exemplary Embodiment 1-1 to Exemplary Embodiment 1-6 forms the electron injection layer by codepositing ytterbium (Yb) and KI in the light emitting diode including the electron transport layer including Liq and a negative electrode including AgMg. In Exemplary Embodiment 1-1 to Exemplary Embodiment 1-6, the content of K included in the electron injection layer was 1 vol %, 3 vol %, 5 vol %, 10 vol %, 15 vol %, and 20 vol %, respectively. Numbers of Table 2 are values corresponding to an average of efficiencies of 30 panels for each condition.

TABLE 2

| | R efficiency | G efficiency | B efficiency | W efficiency |
|---|---|---|---|---|
| Comparative Example 1-1 | 37.4 | 53.8 | 4.973 | 29.9 |
| Exemplary Embodiment 1-1 | 38.3 | 56.3 | 5.131 | 31.2 |
| Exemplary Embodiment 1-2 | 38.6 | 56.8 | 5.179 | 31.2 |
| Exemplary Embodiment 1-3 | 39.1 | 57.1 | 5.218 | 31.2 |
| Exemplary Embodiment 1-4 | 38.9 | 59.0 | 5.360 | 31.7 |
| Exemplary Embodiment 1-5 | 39.6 | 59.0 | 5.467 | 31.9 |
| Exemplary Embodiment 1-6 | 38.3 | 59.1 | 5.492 | 32.0 |

Table 3, below, tabulates results for the light emitting diode including the electron transport layer including Liq and the negative electrode formed of AgYb, and shows the case that Comparative Example 1-1 forms the electron injection layer of ytterbium (Yb), and Exemplary Embodiment 2-1 to Exemplary Embodiment 2-6 form the electron injection layer by codepositing ytterbium (Yb) and KI. In Exemplary Embodiment 2-1 to Exemplary Embodiment 2-6, the content of KI included in the electron injection layer was 1 vol %, 3 vol %, 5 vol %, 10 vol %, 15 vol %, and 20 vol %, respectively.

TABLE 3

| | R efficiency | G efficiency | B efficiency | W efficiency |
|---|---|---|---|---|
| Comparative Example 1-1 | 37.4 | 53.8 | 4.973 | 29.9 |
| Exemplary Embodiment 2-1 | 37.7 | 55.2 | 5.096 | 31.2 |
| Exemplary Embodiment 2-2 | 38.0 | 56.5 | 5.230 | 31.4 |
| Exemplary Embodiment 2-3 | 38.6 | 57.1 | 5.142 | 31.2 |
| Exemplary Embodiment 2-4 | 38.9 | 57.7 | 5.291 | 31.2 |
| Exemplary Embodiment 2-5 | 38.7 | 58.9 | 5.564 | 31.7 |
| Exemplary Embodiment 2-6 | 37.4 | 60.3 | 5.469 | 32.1 |

Referring to Table 2 and Table 3, compared with Comparative Example 1-1, in the case of Exemplary Embodiment 1-1 to Exemplary Embodiment 1-6, and Exemplary Embodiment 2-1 to Exemplary Embodiment 2-6, there was an effect that the white light efficiency was increased by about 4% to 7%.

Table 4, below, shows a result of estimating the reliability of the display panel including the light emitting diode depending on the volume ratio of the two codeposited materials when codepositing ytterbium (Yb) and RbI to form the electron injection layer and codepositing ytterbium (Yb) and KI to form the electron injection layer.

TABLE 4

| Electron injection layer | Volume ratio (vol %) | Reliability | Electron injection layer | Volume ratio (vol %) | Reliability |
|---|---|---|---|---|---|
| Yb:RbI | 9:1 | good | Yb:KI | 9:1 | good |
| Yb:RbI | 8:2 | good | Yb:KI | 8:2 | good |
| Yb:RbI | 7:3 | bad | Yb:KI | 7:3 | bad |
| Yb:RbI | 5:5 | bad | Yb:KI | 5:5 | bad |
| Yb:RbI | 3:7 | bad | Yb:KI | 3:7 | bad |
| Yb:RbI | 1:9 | bad | Yb:KI | 1:9 | bad |
| RbI single | — | bad | KI single | — | bad |

Referring to Table 4, in the case that the volume ratio of ytterbium (Yb) and RbI was 9:1 and 8:2, the display panel was normally operated, while if the content of RbI was over 20 vol %, a phenomenon such as a pattern stain was generated such a defect rate of the display panel was high.

In the ratio of Yb and KI, as KI increases, more of the perovskite structure may be formed in the reactor, and as the perovskite very sensitively reacts to a magnetic field generated in a magnetic jig of an opening aligning device, it may be that a pattern stain such as one formed by the magnetic jig may be generated in the surface during a deposition process. In the case of the perovskite structure, as the perovskite structure has a high dielectric constant of about 10 times or more that of a binary compound, the perovskite structure may sensitively react to the magnetic field change.

As described above, in the light emitting diode according to the present disclosure, the content of the first material having the lanthanide element and the second material having the codeposited alkali metal halide may be in the range of 1 vol % to 20 vol %, with a view toward reliability and light efficiency.

Again referring to FIG. 1, the second electrode 190 may be disposed on the electron injection layer 180. The second electrode 190 may be a transflective electrode.

In an implementation, the transflective electrode may be defined as an electrode including a material having a transflective characteristic transmitting part of light incident to the second electrode 190 and reflecting a remaining part of the light to the first electrode 120. In an implementation, the transflective characteristic may mean that the reflectivity for the incident light is about 0.1% or more to about 70% or less, or about 30% or more to about 50% or less.

In an implementation, the second electrode 190 may include, e.g., silver (Ag), magnesium (Mg), aluminum (Al), chromium (Cr), molybdenum (Mo), tungsten (W), titanium (Ti), gold (Au), palladium (Pd), ytterbium (Yb), or alloys thereof.

When the above-described second electrode 190 is formed of the alloy, an alloy ratio may be controlled by a temperature of a deposition source, an atmosphere, and a vacuum degree, and may be selected as an appropriate ratio. In an implementation, the second electrode 190 may have a thickness of about 50 Å to about 150 Å. Maintaining the thickness of the second electrode 190 at about 50 Å or greater may help ensure that a desired sheet resistance is obtained. Maintaining the thickness at about 150 Å or less may help ensure that the reflectance is not increased and a wide angle distribution (WAD) results, such that a color change may be avoided when being viewed from the side.

In an implementation, the second electrode 190 may be formed of AgMg or AgYb.

When applying the AgMg or AgYb electrode, as the content of Mg or Yb increases, the electron injection barrier may decrease, and many electrons may be injected. If an electron-hole balance in the whole device were to be changed, degradation could be generated such that the lifespan and the efficiency could be sharply reduced. By considering the electron-hole balance, the content of Mg or Yb included in the second electrode 190 may be in the range of about 10 vol % to about 30 vol %.

When comparing the AgMg electrode and the AgYb electrode, because of high ignitability in the case of Mg, AgYb may be used in terms of environmental and safety issues. Also, because Yb may be contained in the electron injecting layer, AgYb may be used with a view toward process and cost aspects, as compared with AgMg electrode manufacturing, because a number of materials required for the AgYb electrode manufacturing may be smaller.

The capping layer 200 may be disposed on the second electrode 190, may be formed of the organic material or an inorganic material, and may have a function of protecting the second electrode 190 or guiding a change of resonance intensity and resonance phase along with the second electrode 190.

Figure 5:
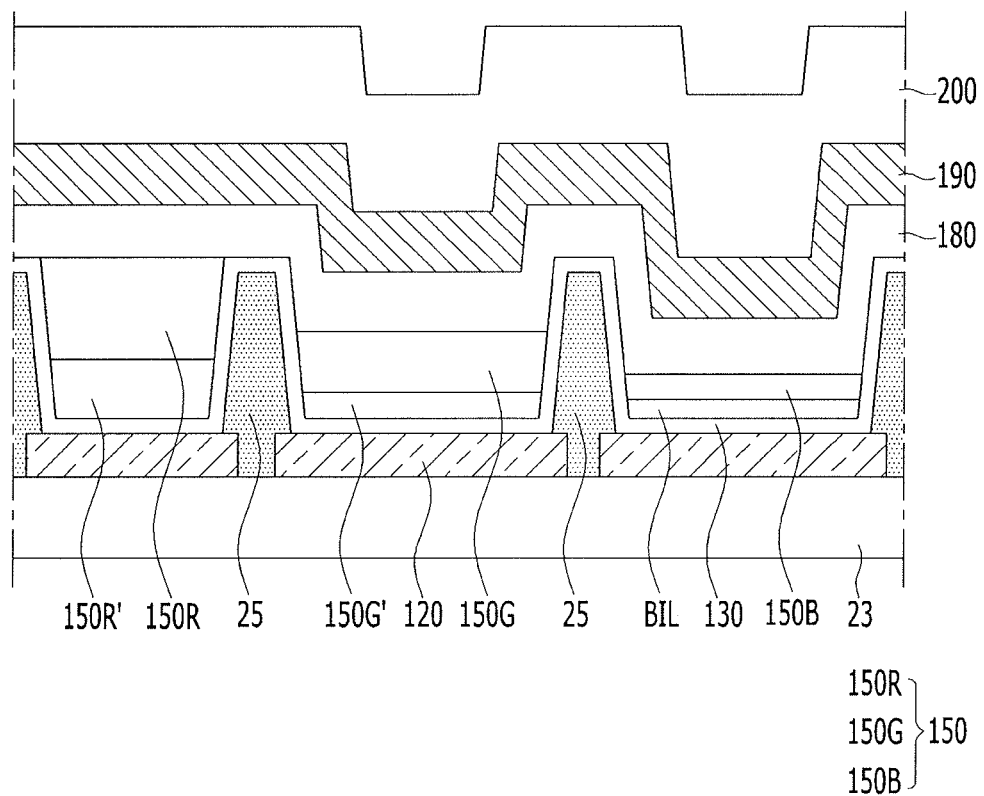
FIG. 5 illustrates a schematic cross-sectional view of a light emitting diode display including an emission layer according to an exemplary embodiment of FIG. 1.

FIG. 5 illustrates a schematic cross-sectional view of a light emitting diode display including an emission layer according to an exemplary embodiment of FIG. 1. In FIG. 5, the light emitting diode respectively corresponding to the red pixel, the green pixel, and the blue pixel is shown on a substrate 23.

Referring to FIG. 5, the emission layer 150 of FIG. 1 may include a red emission layer 150R, a green emission layer 150G, and a blue emission layer 150B, and they may be disposed horizontally in a direction parallel to the first electrode 120. The hole transport layer 130 may be commonly disposed between the red emission layer 150R and the first electrode 120, between the green emission layer 150G and the first electrode 120, and between the blue emission layer 150B and the first electrode 120, and the thickness of the hole transport layer 130 may be substantially the same (e.g., may be uniform).

A pixel definition layer 25 may be disposed between the red emission layer 150B, the green emission layer 150G, and the blue emission layer 150B adjacent to each other.

In an implementation, an auxiliary layer BIL (to help increase efficiency of the blue emission layer 150B) may be disposed under the blue emission layer 150B, and the auxiliary layer BIL may serve to increase the efficiency of the blue emission layer 150B by controlling a hole charge balance. In an implementation, the auxiliary layer BIL may include a compound represented by Chemical Formula 1.

Chemical Formula 1

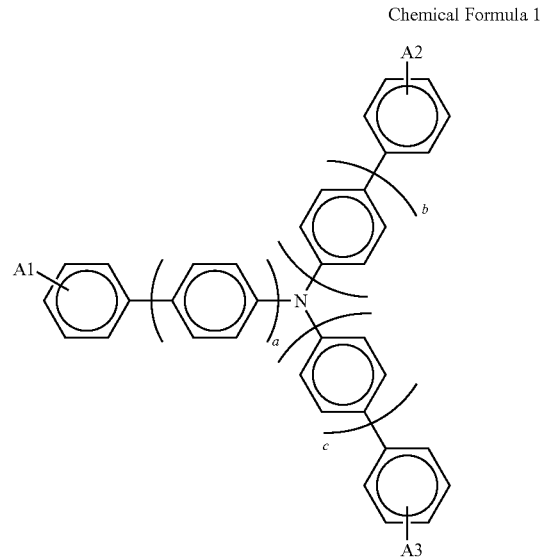

In Chemical Formula 1, A1, A2, and A3 may each independently be, e.g., an alkyl group, an aryl group, carbazole, dibenzothiophene, dibenzofuran (DBF), or biphenyl. a, b, and c may each independently be, e.g., positive numbers of zero to four.

As an example of the compounds represented by Chemical Formula 1, the following Chemical Formulas 1-1, 1-2, 1-3, 1-4, 1-5, and 1-6 may be included.

Chemical Formula 1-1

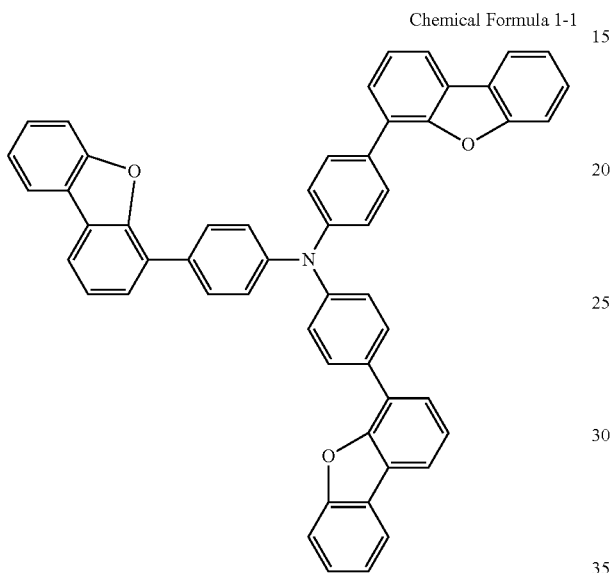

Chemical Formula 1-2

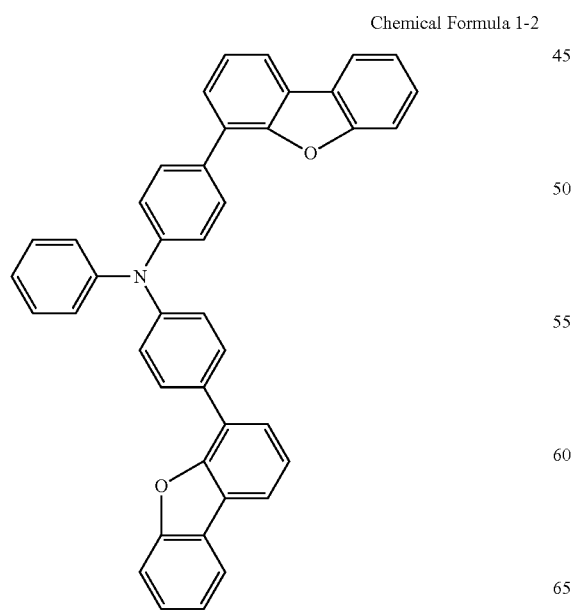

Chemical Formula 1-3

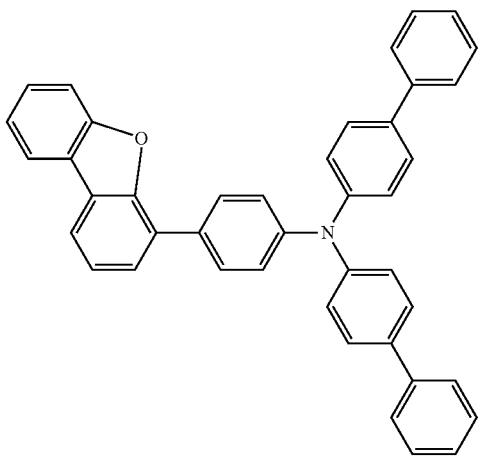

Chemical Formula 1-4

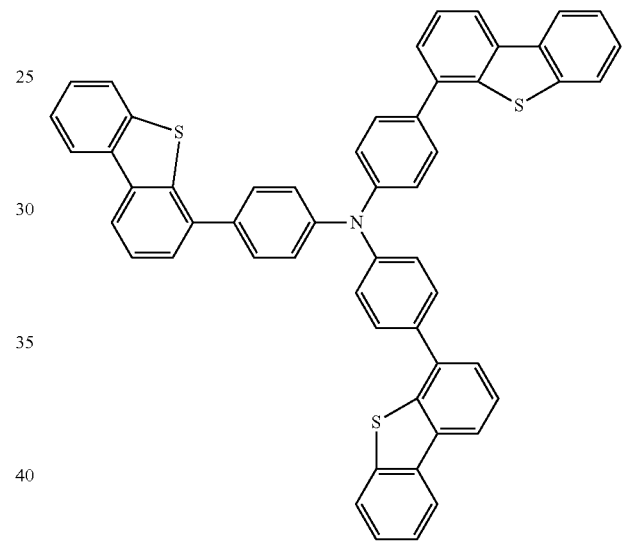

Chemical Formula 1-5

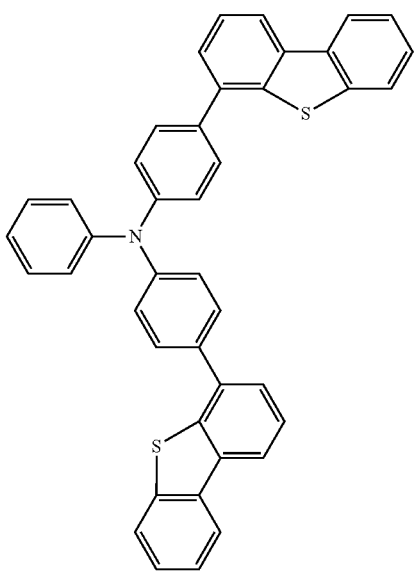

Chemical Formula 1-6

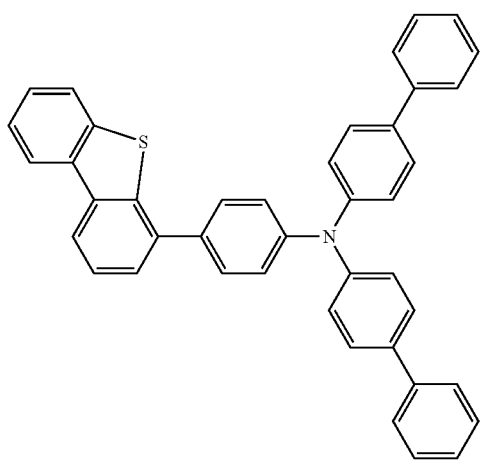

In an implementation, the auxiliary layer BIL may include a compound represented by Chemical Formula 2.

Chemical Formula 2

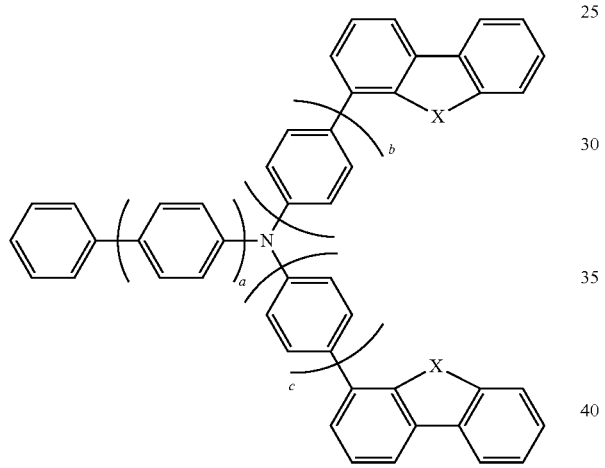

In Chemical Formula 2, a, b, and c may each independently be 0 to 3, each X may independently be O, N, or S.

As an example of the compound represented by Chemical Formula 2, Chemical Formulas 2-1, 2-2, 2-3, 2-4, 2-5, and 2-6 may be included.

Chemical Formula 2-1

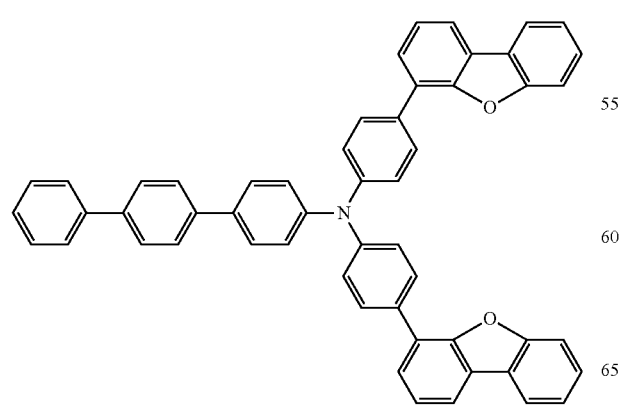

Chemical Formula 2-2

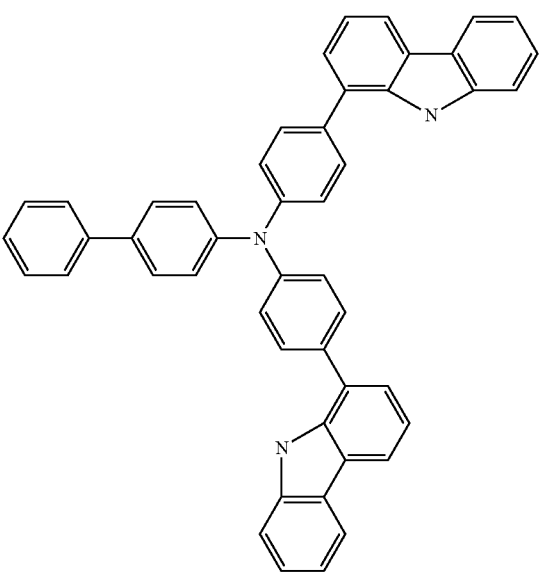

Chemical Formula 2-3

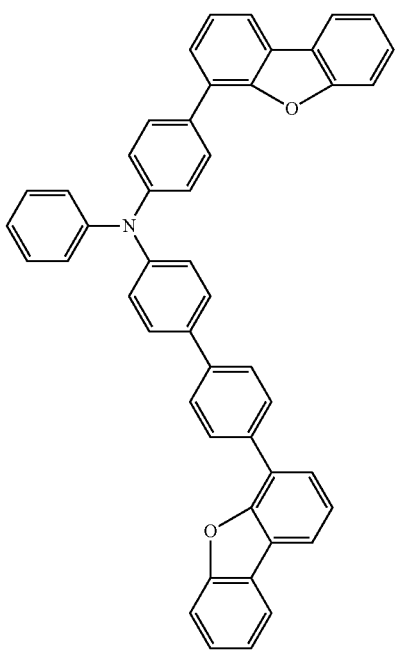

-continued

Chemical Formula 2-4

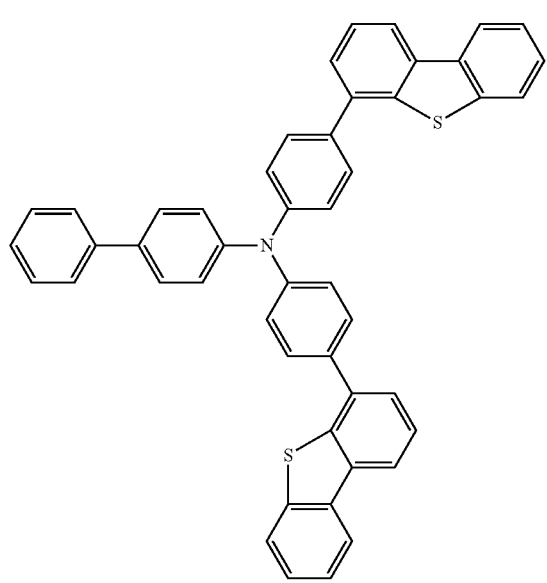

Chemical Formula 2-5

In an implementation, the auxiliary layer (BIL) may include a compound represented by Chemical Formula 3.

Chemical Formula 3

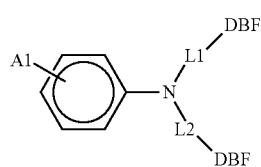

In Chemical Formula 3, A1 may be, e.g., an alkyl group, an aryl group, carbazole, dibenzothiophene, or dibenzofuran (DBF). L1 and L2 may each independently be, e.g.,

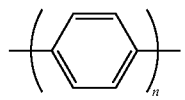

(in which n is 0 to 3). DBF (connected to L1 and L2) may be dibenzofuran or may be a carbazole or dibenzothiophene.

In an implementation, a red resonance auxiliary layer 150R' may be disposed under the red emission layer 150R, e.g., between the red emission layer 150R and the hole transport layer 130, and/or a green resonance auxiliary layer 150G' may be disposed under the green emission layer 150G, e.g., between the green emission layer 150G and the hole transport layer 130. The red resonance auxiliary layer 150R' and/or the green resonance auxiliary layer 150G' may be added to help control a resonance distance for each color. In an implementation, a separate resonance auxiliary layer disposed between the blue emission layer 150B and the auxiliary layer BIL, and the hole transport layer 130, may not be formed under the blue emission layer 150B and the auxiliary layer BIL.

The electron injection layer 180 and the second electrode 190 may be commonly disposed between the red emission layer 150R and the capping layer 200, between the green emission layer 150G and the capping layer 200, and between the blue emission layer 150B and the capping layer 200. A thickness of the electron injection layer 180 and the second electrode 190 may be substantially the same in the commonly disposed portion.

Here, a repeated description of contents described in FIG. 1 may be omitted. The thin film transistor, the element including the interlayer insulating layer, and the insulating layer may be disposed between the substrate 110 and the first electrode 120 that are shown in FIG. 5, however they are omitted in FIG. 5 and will be described with reference to FIG. 7.

Figure 6:
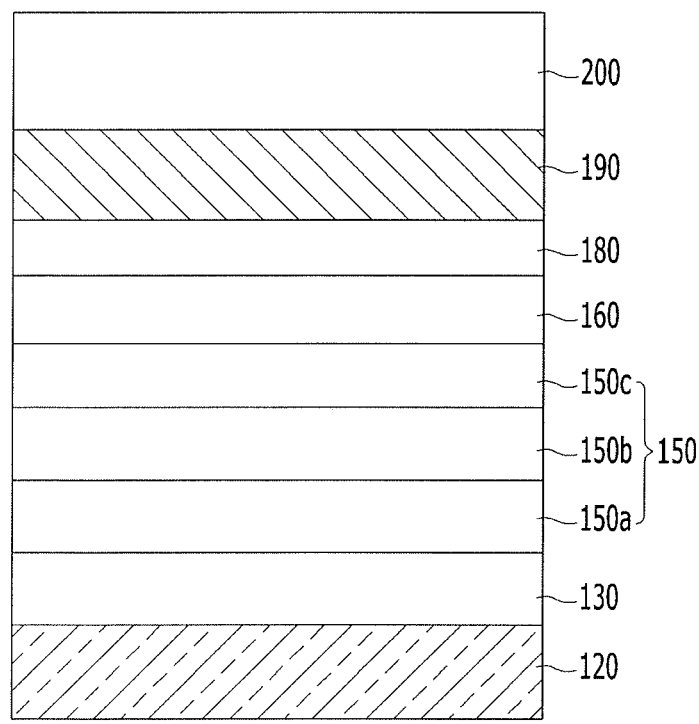
FIG. 6 illustrates a schematic cross-sectional view of an exemplary variation of an emission layer according to an exemplary embodiment of FIG. 5.

FIG. 6 illustrates a schematic cross-sectional view schematically showing an exemplary variation of an emission layer according to an exemplary embodiment of FIG. 5.

FIG. 6 shows almost the same configurations as for the light emitting diode described in FIG. 1. Next, differences from the exemplary embodiment of FIG. 1 will be described, and the contents described with reference to FIG. 1 may all be applied to the exemplary embodiment of FIG. 6.

Referring to FIG. 6, the light emitting diode according to the present exemplary embodiment may include the emission layer 150 emitting white light or blue light by combining a plurality of layers 150a, 150b, and 150c representing the different colors (e.g., by combining light emitted by the plurality of layers 150a, 150b, and 150c). In an implementation, the plurality of layers may have a structure in which two or three layers are deposited, e.g., an emission layer 150 having three layers is shown in FIG. 6.

The three layers of the emission layer 150 may respectively represent blue, yellow, and blue, and, in an implementation, two layers of the emission layer may respectively represent blue and yellow. In an implementation, at least one charge generating layer may be disposed between adjacent layers among the plurality of layers 150a, 150b, and 150c of FIG. 6.

The description related to the electron injection layer 180 described in FIG. 1 may be applied to the light emitting diode of FIG. 6.

Figure 7:
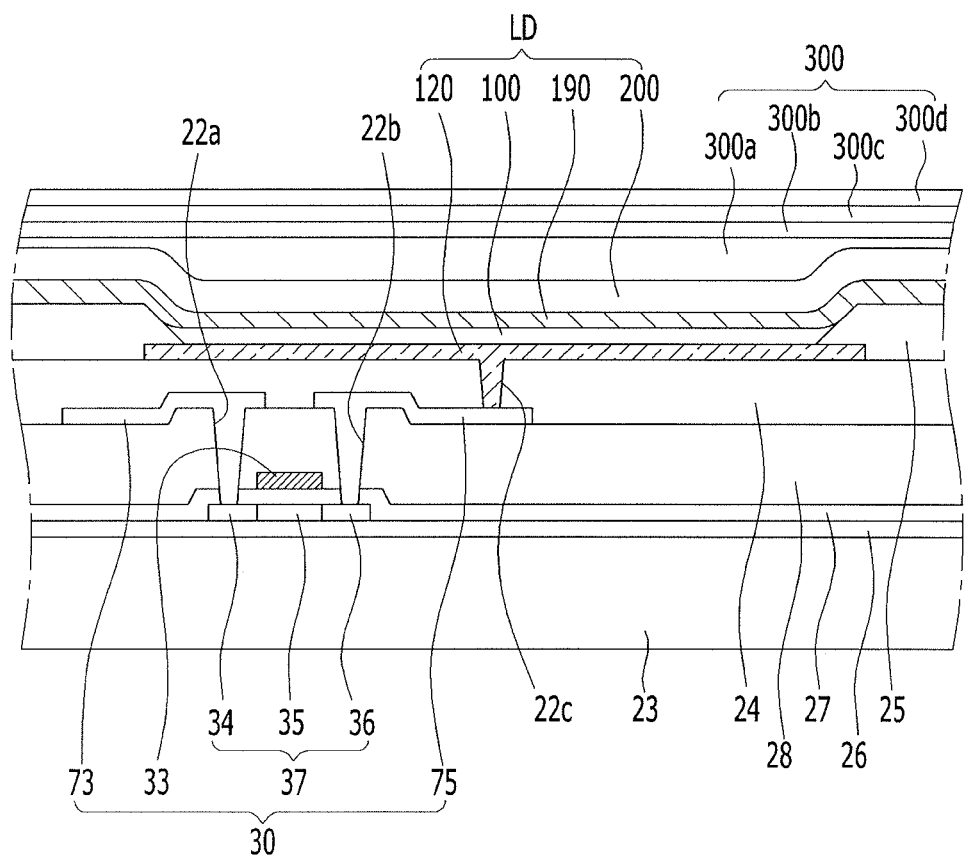
FIG. 7 illustrates a schematic cross-sectional view of a light emitting diode display according to an exemplary embodiment of the present disclosure.

FIG. 7 illustrates a schematic cross-sectional view of a light emitting diode display according to an exemplary embodiment of the present disclosure.

Referring to FIG. 7, the organic light emitting diode display according to an exemplary embodiment of the present disclosure may include a substrate 23, a driving thin film transistor 30, a first electrode 120, a light emitting diode layer 100, and a second electrode 190. The first electrode 120 may be the anode and the second electrode 190 may be the cathode, or the first electrode 120 may be the cathode and the second electrode 190 may be the anode.

A substrate buffer layer 26 may be disposed on the substrate 23. The substrate buffer layer 26 may help prevent penetration of impure elements and may help planarize the surface. In an implementation, the substrate buffer layer 26 may be omitted according to the type and process conditions of the substrate 23.

A driving semiconductor layer 37 may be formed on the substrate buffer layer 26. The driving semiconductor layer 37 may be formed of a material including a polysilicon. The driving semiconductor layer 37 includes a channel region 35 not doped with an impurity, and a source region 34 and a drain region 36 doped with an impurity at respective sides of the channel region 35. The doped ion materials may be P-type impurities such as boron (B), and, e.g., $B_2H_6$ may be used. The impurities may depend on the type of the thin film transistor.

A gate insulating layer 27 may be disposed on the driving semiconductor layer 37. A gate wire including a driving gate electrode 33 may be disposed on the gate insulating layer 27. The driving gate electrode 33 may overlap at least a portion of the driving semiconductor layer 37, e.g., the channel region 35.

An interlayer insulating layer 28 covering the gate electrode 33 may be formed on the gate insulating layer 27. A first contact hole 22a and a second contact hole 22b that respectively expose the source region 34 and the drain region 36 of the driving semiconductor layer 37 may be formed in the gate insulating layer 27 and the interlayer insulating layer 28. A data wire including a driving source electrode 73 and a driving drain electrode 75 may be disposed on the interlayer insulating layer 28. The driving source electrode 73 and the driving drain electrode 75 may be connected to the source region 34 and the drain region 36 of the driving semiconductor layer 37 through the first contact hole 22a and the second contact hole 22b formed in the interlayer insulating layer 28 and the gate insulating layer 27, respectively.

As described above, the driving thin film transistor 30 including the driving semiconductor layer 37, the driving gate electrode 33, the driving source electrode 73, and the driving drain electrode 75 may be formed. In an implementation, the configuration of the driving thin film transistor 30 may be variously modified as desired.

In addition, a planarization layer 24 covering the data wire may be formed on the interlayer insulating layer 28. The planarization layer 24 may help remove and planarize a step in order to increase emission efficiency of the light emitting diode to be formed thereon. The planarization layer 24 may have a third contact hole 22c to electrically connect the driving drain electrode 75 and the first electrode that is described later.

In an implementation, one of the planarization layer 24 and the interlayer insulating layer 28 may be omitted.

The first electrode 120 of the light emitting diode LD may be disposed on the planarization layer 24. The pixel definition layer 25 may be disposed on the planarization layer 24 and the first electrode 120. The pixel definition layer 25 has an opening overlapping a part of the first electrode 120. In this case, the light emitting diode layer 100 may be disposed for each opening formed in the pixel definition layer 25.

In an implementation, the light emitting diode layer 100 may be disposed on the first electrode 120. The light-emitting element layer 100 may correspond to or include. e.g., the hole transport layer 130, the emission layer 150, the electron transport layer 160, and the electron injection layer 180 in the light emitting diode described in FIG. 1

The contents related to the light emitting diode described in FIG. 5 and FIG. 6 may all be applied to the light emitting diode display according to the present disclosure.

In an implementation, as shown in FIG. 7, the light emitting diode layer 100 may only be disposed in the opening of the pixel definition layer 25. In an implementation, as shown in FIG. 5, partial layers configuring the light emitting diode layer 100 may also be disposed on the upper surface of the pixel definition layer 25 like the second electrode 190.

A second electrode 190 and a capping layer 200 may be disposed on the light emitting diode layer 100.

A thin film encapsulation layer 300 may be disposed on the capping layer 200. The thin film encapsulation layer 300 may encapsulate the light emitting diode LD formed on the substrate 23 and a driving circuit to protect them from the outside.

The thin film encapsulation layer 300 may include organic encapsulation layers 300a and 300c and inorganic encapsulation layers 300b and 300d that are alternately deposited one by one. In an implementation, as illustrated in FIG. 7, the thin film encapsulation layer 300 may be configured by alternately depositing two organic encapsulation layers 300a and 300c and two inorganic encapsulation layers 300b and 300d one by one.

Figure 8:
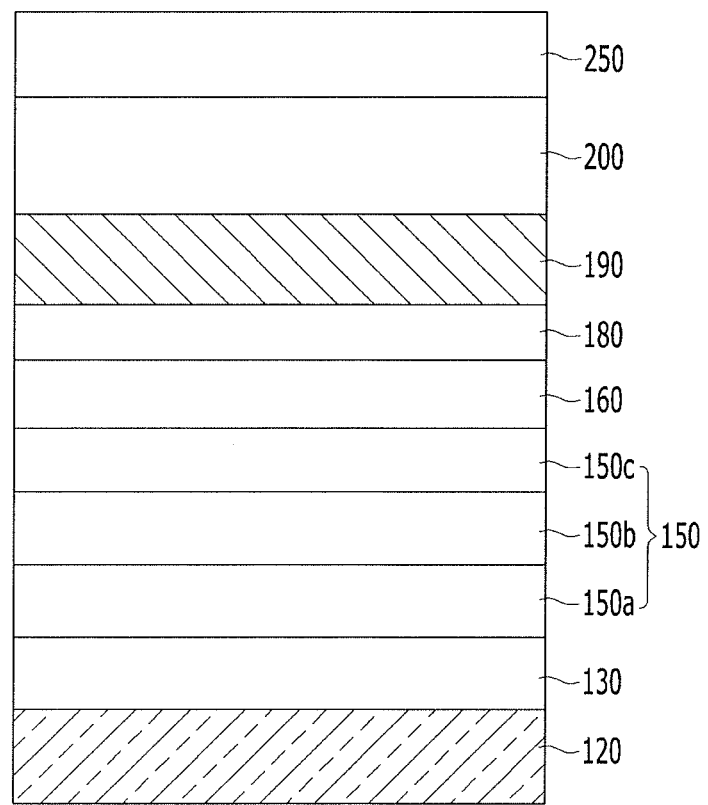
FIG. 8 illustrates a schematic cross-sectional view showing a color conversion layer disposed on the light emitting diode according to an exemplary embodiment of FIG. 6.

FIG. 8 illustrates a schematic cross-sectional view showing a color conversion layer disposed on the light emitting diode according to an exemplary embodiment of FIG. 6.

FIG. 8 shows almost the same configurations as for the light emitting diode described in FIG. 6. Next, differences from the exemplary embodiment of FIG. 6 will be described, and the contents described with reference to FIG. 6 may all be applied to the exemplary embodiment of FIG. 8.

Referring to FIG. 8, a color conversion layer 250 is disposed on the capping layer 200 or the second electrode 190 and overlying the emission layer 150. In an implementation, the light generated from the emission layer 150 may realize the desired color while passing through the color conversion layer 250 on the second electrode 190. The color conversion layer 250 may be formed in plural to correspond to each pixel area. The plurality of color conversion layers may include, e.g., red, green, and blue color filters including a dye or a pigment, and may include nanoparticles having different sizes, e.g., quantum dots. When the emission layer 150 emits blue light, the blue color filter may be omitted or the transmission layer may be formed at the portion corresponding to the blue pixel area instead of the color conversion layer 250 such that the blue light generated from the emission layer 150 may be transmitted as it is. Here, as well as the case that the plurality of layers 150a, 150b, and 150c are combined to emit blue light, it is also possible to form a light emitting diode structure by the combination of the emission layer emitting blue light as the single layer and the color conversion layer 250. The position of the color conversion layer 250 described in FIG. 8 may be changed.

By way of summation and review, a light emitting diode may have low emission efficiency, a high driving voltage may be required to obtain high luminance required of the display or a light, and resultantly, a lifespan of the element may be shortened.

The embodiments may provide a light emitting diode improving light emitting efficiency, and a light emitting diode display.

According to the exemplary embodiments, by forming the electron injection layer lowering the electron injection barrier and increasing a mobility of the electron, the light emission efficiency may be increased.

DESCRIPTION OF SYMBOLS

| | |
|---|---|
| 100: light emitting diode layer | 120: first electrode |
| 130: hole transport layer | 150: emission layer |
| 160: electron transport layer | 180: electron injection layer |
| 190: second electrode | 200: capping layer |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode, comprising:
a first electrode;
a second electrode overlapping the first electrode;
an emission layer between the first electrode and the second electrode; and
an electron injection layer between the second electrode and the emission layer,
wherein the electron injection layer includes a lanthanide element, an alkali metal first element, and a halogen second element,
wherein the lanthanide element is ytterbium (Yb), samarium (Sm), or europium (Eu),
wherein the first element is potassium (K), rubidium (Rb), or cesium (Cs),
wherein the second element is chlorine (Cl), bromine (Br), or iodine (I), and
wherein the first element and the second element are included in the electron injection layer in an amount of 1 vol % to 20 vol %, and the lanthanide element is included in the electron injection layer in an amount of 99 vol % to 80 vol %, based on a total volume of a material including the lanthanide element, the first element, and the second element.

2. The light emitting diode as claimed in claim 1, wherein the electron injection layer includes a dipole material, the dipole material including the lanthanide element and the second element that have different polarities from each other.

3. The light emitting diode as claimed in claim 2, wherein the dipole material includes a compound including the lanthanide element as a bivalent element or a compound including the lanthanide element as a trivalent element.

4. The light emitting diode as claimed in claim 1, wherein:
the electron injection layer includes a first compound made of the lanthanide element, the first element, and the second element, and
the first compound has a perovskite structure.

5. The light emitting diode as claimed in claim 1, wherein the electron injection layer includes a positive ion of the first element.

6. The light emitting diode as claimed in claim 1, wherein the electron injection layer includes a monomolecular molecule including the lanthanide element.

7. The light emitting diode as claimed in claim 1, wherein the electron injection layer includes a dipole material having the lanthanide element and the second element with different polarities from each other, a first compound made of the lanthanide element, the first element, and the second element and having a perovskite structure, a positive ion of the first element, or a monomolecular molecule including the lanthanide element.

8. The light emitting diode as claimed in claim 1, wherein the first element is potassium (K) and the second element is iodine (I).

9. The light emitting diode as claimed in claim 1, wherein the second electrode includes:
magnesium (Mg) or ytterbium (Yb), and
an alloy of silver (Ag).

10. The light emitting diode as claimed in claim 9, wherein the magnesium (Mg) or ytterbium (Yb) is included in the second electrode in an amount of 10 vol % to 30 vol %.

11. The light emitting diode as claimed in claim 1, further comprising an electron transport layer between the emission layer and the electron injection layer, wherein the electron transport layer includes an organic material.

12. The light emitting diode as claimed in claim 1, wherein:
the emission layer includes a red emission layer, a green emission layer, and a blue emission layer, and
an auxiliary layer is included between the blue emission layer and the first electrode.

13. The light emitting diode as claimed in claim 12, further comprising:
a red resonance auxiliary layer between the red emission layer and the first electrode; and
a green resonance auxiliary layer between the green emission layer and the first electrode.

14. A light emitting diode, comprising:
a first electrode;
a second electrode overlapping the first electrode;
an emission layer between the first electrode and the second electrode; and
an electron injection layer between the second electrode and the emission layer,
wherein:
the electron injection layer includes a lanthanide element, an alkali metal first element, and a halogen second element,
the lanthanide element is ytterbium (Yb), samarium (Sm), or europium (Eu),
the first element is potassium (K), rubidium (Rb), or cesium (Cs),
the second element is chlorine (Cl), bromine (Br), or iodine (I), and
the lanthanide element is included in the electron injection layer in an amount of 99 vol % to 80 vol %, based on a total volume of a material including the lanthanide element, the first element, and the second element.

15. The light emitting diode as claimed in claim 14, wherein the electron injection layer includes a compound including the lanthanide element as a bivalent element or a compound including the lanthanide element as a trivalent element.

16. The light emitting diode of claim 15, wherein the electron injection layer further includes a monomolecular molecule including the lanthanide element.

17. The light emitting diode as claimed in claim 16, wherein:
the electron injection layer further includes a first compound made of the lanthanide element, the first element, and the second element; and
the first compound has a perovskite structure.

18. A light emitting diode display, comprising:
a substrate;
a thin film transistor on the substrate; and
a light emitting diode connected to the thin film transistor, wherein:
the light emitting diode includes a first electrode, a second electrode overlapping the first electrode, an emission layer between the first electrode and the second electrode, and an electron injection layer between the second electrode and the emission layer,
the electron injection layer includes a lanthanide element, an alkali metal first element, and a halogen second element,
the lanthanide element is ytterbium (Yb), samarium (Sm), or europium (Eu),
the first element is potassium (K), rubidium (Rb), or cesium (Cs),
the second element is chlorine (Cl), bromine (Br), or iodine (I), and
the first element and the second element are included in the electron injection layer in an amount of 1 vol % to 20 vol %, and the lanthanide element is included in the electron injection layer in an amount of 99 vol % to 80 vol %, based on a total volume of a material including the lanthanide element, the first element, and the second element.

19. The light emitting diode display as claimed in claim 18, wherein the electron injection layer includes a dipole material having the lanthanide element and the second element that have different polarities from each other.

20. The light emitting diode display as claimed in claim 19, wherein the dipole material includes a compound including the lanthanide element as a bivalent element or a compound including the lanthanide element as a trivalent element.

21. The light emitting diode display as claimed in claim 18, wherein:
the electron injection layer includes a first compound made of the lanthanide element, the first element, and the second element; and
the first compound has a perovskite structure.

22. The light emitting diode display as claimed in claim 18, wherein the emission layer is to emit white light or blue light by combining light from a plurality of layers.

23. The light emitting diode display as claimed in claim 22, further comprising a color conversion layer on the second electrode and overlying the emission layer.

* * * * *